(12) United States Patent
Mueller (10) Patent No.: US 7,990,758 B2
(45) Date of Patent: Aug. 2, 2011

(54) POWER SAVING SEMICONDUCTOR MEMORY

(75) Inventor: Stephen Mueller, Foothill Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/901,930

(22) Filed: Oct. 11, 2010

(65) Prior Publication Data

US 2011/0026310 A1 Feb. 3, 2011

Related U.S. Application Data

(62) Division of application No. 11/864,285, filed on Sep. 28, 2007, now Pat. No. 7,835,202.

(60) Provisional application No. 60/946,243, filed on Jun. 26, 2007.

(51) Int. Cl.
*G11C 11/00* (2006.01)

(52) U.S. Cl. .............. 365/154; 365/189.16; 365/227; 365/230.01; 365/230.06

(58) Field of Classification Search ........... 365/230.01, 365/230.06, 154, 189.16, 227
See application file for complete search history.

(56) References Cited

U.S. PATENT DOCUMENTS

| | | | | |
|---|---|---|---|---|
| 5,596,545 | A | * | 1/1997 | Lin ........................ 365/236 |
| 5,748,554 | A | * | 5/1998 | Barth et al. ............. 365/230.03 |
| 6,314,042 | B1 | * | 11/2001 | Tomishima et al. ..... 365/230.03 |
| 7,835,202 | B2 | | 11/2010 | Mueller |
| 2006/0203532 | A1 | * | 9/2006 | Perego et al. ............. 365/63 |
| 2009/0003120 | A1 | | 1/2009 | Mueller |

* cited by examiner

*Primary Examiner* — Pho M Luu
*Assistant Examiner* — Tha-O Bui
(74) *Attorney, Agent, or Firm* — Fiala & Weaver P.L.L.C.

(57) ABSTRACT

A semiconductor memory, such as an SRAM, is described that accommodates smaller read/write accesses in one mode of operation and larger read/write accesses in a second mode of operation, wherein power is conserved during the smaller accesses. Methods of using such a semiconductor memory are also described.

10 Claims, 10 Drawing Sheets

FIG. 11

POWER SAVING SEMICONDUCTOR MEMORY

CROSS-REFERENCE TO RELATED APPLICATIONS

This application is a divisional of U.S. patent application Ser. No. 11/864,285, filed Sep. 28, 2007 (now allowed), which claims priority to U.S. Provisional Patent Application No. 60/946,243, filed Jun. 26, 2007. The entirety of each of these applications is incorporated by reference herein.

BACKGROUND OF THE INVENTION

1. Field of the Invention

The invention generally relates to semiconductor memories. In particular, the invention relates to a semiconductor memory that is configured to conserve power when performing read and write accesses.

2. Background

Semiconductor memories, such as static random access memories (SRAMs), are used in a wide variety of systems and devices. For example, SRAMS are used for data storage in a wide variety of battery-powered portable electronic devices. Power savings is a critical feature for such devices, as they are required to provide continuous operation using only a limited power source.

For some applications, the amount of data to be accessed from an SRAM may vary over time. For example, for one set of operations, only individual bytes of data may need to be accessed while for another set of operations, a larger amount of data may need to be accessed. To facilitate the larger accesses, the SRAM may be designed to accommodate reads and writes of more than a byte of data. For example, the SRAM may be designed to accommodate reads and writes of 4-byte words or 32-byte words.

However, by designing the SRAM to accommodate the larger reads and writes, power is wasted in instances where less than the largest amount of data needs to be read or written. For example, assume that the SRAM has been designed to accommodate a 32-byte read but that only a byte of data needs to be read from the SRAM. In this example, sense amplifiers associated with 256 columns of the SRAM will be activated even though data associated with only 8 columns of the SRAM needs to be read. This results in a waste of power. As a further example, assume that the SRAM has been designed to accommodate a 32-byte write but that only a byte of data needs to be written to the SRAM. In this example, write circuits associated with 256 columns of the SRAM will be activated even though data associated with only 8 columns of the SRAM needs to be written. This also results in a waste of power.

What is needed, then, is a semiconductor memory, such as an SRAM, that accommodates smaller accesses in one mode of operation and larger accesses in a second mode of operation, wherein power is conserved during the smaller accesses. Such a semiconductor memory could advantageously be used to conserve power in a system or device having a limited power supply.

BRIEF SUMMARY OF THE INVENTION

A semiconductor memory, such as an SRAM, is described herein that accommodates smaller accesses in one mode of operation and larger accesses in a second mode of operation, wherein power is conserved during the smaller accesses. Methods of using such a semiconductor memory are also described. A semiconductor memory in accordance with an embodiment of the present invention may advantageously be used to conserve power in a system or device having a limited power supply.

In particular, a method for reading data from an array of memory cells, such as an array of SRAM cells, is described herein. The array of memory cells is arranged as a plurality of rows and a plurality of columns. In accordance with the method, an individual row is selected from the plurality of rows based on one or more first address signals. A series of columns is selected from the plurality of columns based on one or more second address signals. It is then determined whether a control signal is active. Responsive to determining that the control signal is active, sense amplifiers associated only with a subset of the columns in the series of columns are activated and data is read only from memory cells located in both the selected row and in the columns associated with the activated sense amplifiers.

In accordance with one implementation of the foregoing method, selecting a series of columns from the plurality of columns includes selecting a number of columns corresponding to a word of data, wherein a word of data includes a greater number of bits than a byte of data. Furthermore, in accordance with one implementation of the foregoing method, activating sense amplifiers associated only with a subset of the columns in the series of columns includes activating sense amplifiers associated with a number of columns corresponding to a byte of data. The method may further include, responsive to determining that the control signal is not active, activating sense amplifiers associated with each of the columns in the series of columns, and reading data only from memory cells located in both the selected row and in the columns associated with the activated sense amplifiers.

A semiconductor memory is also described herein. The semiconductor memory includes an array of memory cells, such as an array of SRAM cells, a row decoder, a first column decoder, and a second column decoder. The array of memory cells is arranged as a plurality of rows and a plurality of columns. The row decoder is coupled to the array of memory cells and is configured to select an individual row from the plurality of rows based on one or more first address signals. The first column decoder is coupled to the array of memory cells and is configured to select a series of columns from the plurality of columns based on one or more second address signals. The second column decoder is coupled to the first column decoder and the array of memory cells. The second column decoder is configured to determine whether a control signal is active and, responsive to determining that the control signal is active, to activate sense amplifiers associated only with a subset of the columns in the series of columns and to read data only from memory cells located in both the selected row and in the columns associated with the activated sense amplifiers.

In accordance with one implementation of the foregoing semiconductor memory, the first column decoder is configured to select a series of columns from the plurality of columns by selecting a number of columns corresponding to a word of data, wherein a word of data includes a greater number of bits than a byte of data. Furthermore, in accordance with one implementation of the foregoing semiconductor memory, the second column decoder is configured to activate sense amplifiers associated only with a subset of the columns in the series of columns by activating sense amplifiers associated with a number of columns corresponding to a byte of data. The second column decoder may be further configured, responsive to determining that the control signal is not active, to activate sense amplifiers associated with each of the columns in the series of columns and to read data only from memory cells located in both the selected row and in the columns associated with the activated sense amplifiers.

A method for writing data to an array of memory cells, such as an array of SRAM cells, is also described herein. The array of memory cells is arranged as a plurality of rows and a plurality of columns. In accordance with the method, an individual row is selected from the plurality of rows based on one or more first address signals. A series of columns is selected from the plurality of columns based on one or more second address signals. It is then determined whether a control signal is active. Responsive to determining that the control signal is active, write circuits associated only with a subset of the columns in the series of columns are activated and data is written only to memory cells located in both the selected row and in the columns associated with the activated write circuits.

In accordance with one implementation of the foregoing method, selecting a series of columns from the plurality of columns includes selecting a number of columns corresponding to a word of data, wherein a word of data includes a greater number of bits than a byte of data. Furthermore, in accordance with one implementation of the foregoing method, activating write circuits associated only with a subset of the columns in the series of columns includes activating write circuits associated with a number of columns corresponding to a byte of data. The method may further include, responsive to determining that the control signal is not active, activating write circuits associated with each of the columns in the series of columns, and writing data only to memory cells located in both the selected row and in the columns associated with the activated write circuits.

A further semiconductor memory is described herein. The semiconductor memory includes an array of memory cells, such as an array of SRAM cells, a row decoder, a first column decoder and a second column decoder. The array of memory cells is arranged as a plurality of rows and a plurality of columns. The row decoder is coupled to the array of memory cells and is configured to select an individual row from the plurality of rows based on one or more first address signals. The first column decoder is coupled to the array of memory cells and is configured to select a series of columns from the plurality of columns based on one or more second address signals. The second column decoder is coupled to the first column decoder and the array of memory cells. The second column decoder is configured to determine whether a control signal is active and, responsive to determining that the control signal is active, to activate write circuits associated only with a subset of the columns in the series of columns and to write data only to memory cells located in both the selected row and in the columns associated with the activated write circuits.

In accordance with one implementation of the foregoing semiconductor memory, the first column decoder is configured to select a series of columns from the plurality of columns by selecting a number of columns corresponding to a word of data, wherein a word of data includes a greater number of bits than a byte of data. Furthermore, in accordance with one implementation of the foregoing semiconductor memory, the second column decoder may be configured to activate write circuits associated only with a subset of the columns in the series of columns by activating write circuits associated with a number of columns corresponding to a byte of data. The second column decoder may be further configured, responsive to determining that the control signal is not active, to activate write circuits associated with each of the columns in the series of columns and to write data only to memory cells located in both the selected row and in the columns associated with the activated write circuits.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

A. Overview

A semiconductor memory, such as an SRAM, is described herein that accommodates smaller accesses in one mode of operation and larger accesses in a second mode of operation, wherein power is conserved during the smaller accesses. The invention is applicable to both read and write accesses to the semiconductor memory.

The semiconductor memory includes an array of memory cells arranged as a plurality of rows and a plurality of columns. During a read access, the semiconductor memory selects one row from the plurality of rows. The semiconductor memory also selects a series of columns from the plurality of columns, wherein the series of columns corresponds to the largest amount of data that can be read from the semiconductor memory at one time. Then, based on one or more control signals, the semiconductor memory either reads the largest amount of data that can be read at one time from memory cells located in the selected row and the selected series of columns, or a smaller amount of data from memory cells located in the selected row and in the subset of the selected series of columns. In an instance where the largest amount of data is read, a sense amplifier associated with each column in the series of columns is activated. In an instance where a smaller amount of data is read, only those sense amplifiers associated with the subset of the series of columns are activated, thereby conserving power.

During a write access, the semiconductor memory selects one row from the plurality of rows. The semiconductor memory also selects a series of columns from the plurality of columns, wherein the series of columns corresponds to the largest amount of data that can be written to the semiconductor memory at one time. Then, based on one or more control signals, the semiconductor memory either writes the largest amount of data that can be written at one time to memory cells located in the selected row and the selected series of columns, or a smaller amount of data to memory cells located in the selected row and in the subset of the selected series of columns. In an instance where the largest amount of data is written, a write circuit associated with each column in the series of columns is activated. In an instance where a smaller amount of data is written, only those write circuits associated with the subset of the series of columns are activated, thereby conserving power.

In an example embodiment of the present invention described below, the largest amount of data that can be accessed by the semiconductor memory at one time is a 32-byte word. However, the invention is not so limited and the largest amount of data that can be accessed by the semiconductor memory at one time can be any amount of data, provided it exceeds the smaller access size(s) permitted by the semiconductor memory.

Furthermore, in an example embodiment of the present invention described below, only one smaller access size is permitted—namely, a single byte access. However, persons skilled in the relevant art(s) will readily appreciate that any smaller access size may be used, provided it is smaller than the largest amount of data that can be accessed by the semiconductor memory. Thus, for example, in one implementation of the present invention, the largest amount of data that can be accessed at one time may be 2 bits, while the smaller access size may be 1 bit.

Also, the present invention is not limited to only a single smaller access size. Rather, depending on the design of the semiconductor memory and the configuration of the control signals used to control the operation of the semiconductor memory, multiple smaller access sizes may be accommodated. Thus, for example, in one implementation of the present invention, the largest amount of data that can be accessed at one time may be 48 bits, while smaller accesses of anywhere from 1 to 47 bits may be allowed.

These and other implementations of the present invention will be readily understood by persons skilled in the relevant art(s) based on the teachings provided herein. A particular example implementation of a power-saving semiconductor memory in accordance with the present invention will now be described, although the present invention is not limited to this implementation.

Figure 1:
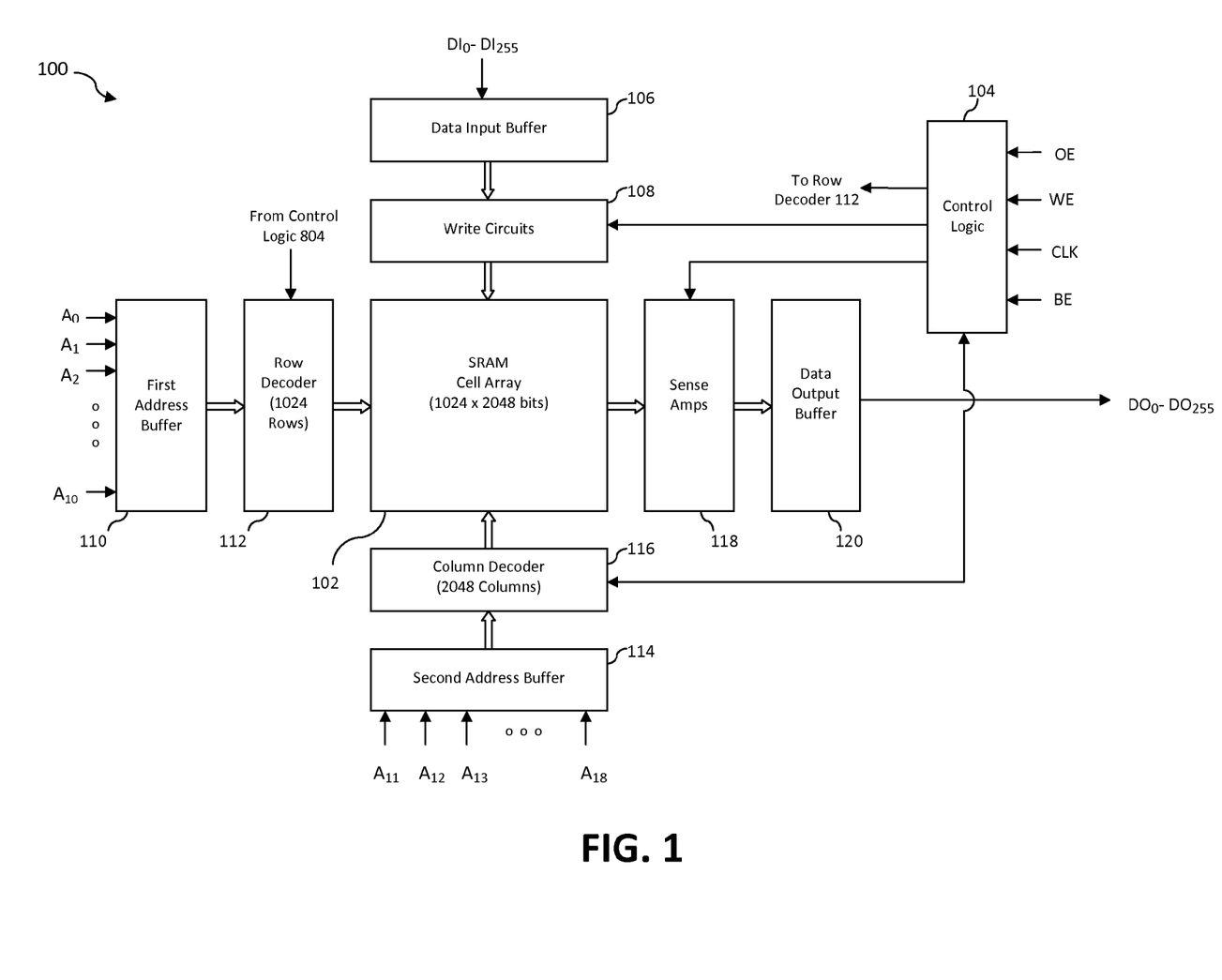
FIG. 1 is a block diagram of an example semiconductor memory in accordance with an embodiment of the present invention.

B. Example Power-Saving Semiconductor Memory in Accordance with an Embodiment of the Present Invention FIG. 1 is a block diagram of an example semiconductor memory 100 in accordance with an embodiment of the present invention. Semiconductor memory 100 is an SRAM, although the invention is not so limited and may be implemented in other semiconductor memories. As shown in FIG. 1, SRAM 100 includes an array of memory cells 102 arranged in rows and columns as well as logic for selectively writing data to and reading data from each of those memory cells. The memory cells in array 102 are arranged in 1024 rows and 2048 columns. However, as will be readily appreciated by persons skilled in the relevant art(s), other memory cell array sizes may be used in accordance with the present invention.

SRAM 100 also includes logic for selectively writing data to and reading data from each of the memory cells in memory cell array 102. As will be described in more detail herein, SRAM 100 is configured to support 32-byte word read and write accesses to memory cell array 102 in one mode of operation as well as individual byte (8-bit) read and write accesses to memory cell array 102 that consume less power in another mode of operation. However, as discussed above in Section A, the invention is not limited to these access sizes; nor is the invention limited to only one smaller access size.

In addition to memory cell array 102, SRAM 100 further includes control logic 104, a data input buffer 106, write circuits 108, a first address buffer 110, a row decoder 112, a second address buffer 114, a column decoder 116, sense amplifiers 118, and a data output buffer 120. The function of each of these components will now be described.

Data input buffer 106 is configured to receive and temporarily store 256 data input signals (denoted $DI_0$ through $DI_{255}$) for write operations. In a mode of operation in which a 32-byte word is being written to a location within memory cell array 102, all 256 data input signals will be used when performing the write. In a mode of operation in which only a single byte is being written to a location within memory cell array 102, only 8 of the 256 data input signals will be used when performing the write.

Data input buffer 106 is connected to write circuits 108. In SRAM 100, there are a total of 2048 write circuits, one corresponding to each column in memory cell array 102. When activated, each write circuit is configured to apply a corresponding data input signal to bit lines that run along the column with which the write circuit is associated. In a mode of operation in which a 32-byte word is being written to a location within memory cell array 102, 256 write circuits are activated to perform the write. In a mode of operation in which only a single byte is being written to a location within memory cell array 102, only 8 write circuits are activated to perform the write.

First address buffer 110 is configured to receive and temporarily store 11 address signals (denoted $A_0$ through $A_{10}$). Row decoder 112 is connected to first address buffer 110 and is configured to use such address signals to select one of the 1024 rows within memory cell array 102 from which data is to be read during a read access or to which data is to be written during a write access.

Second address buffer 114 is configured to receive and temporarily store 8 address signals (denoted $A_{11}$ through $A_{18}$). Column decoder 116 is connected to second address buffer 114 and is configured to use such address information to select 256 of the 2048 columns within memory cell array 102 from which data is to be read during a read access or to which data is to be written during a write access in a first mode of operation, or to use such address information to select only 8 of the 2048 columns within memory cell array 102 from which data is to be read during a read access or to which data is to be written during a write access during a second mode of operation. Thus, during the first mode of operation, column decoder 116 selects the number of columns necessary for a 32-byte word read/write access and, during the second mode of operation, column decoder 116 selects the number of columns necessary for a single byte read/write access.

Write circuits 108 are connected to column decoder 116 and memory cell array 102. When column decoder 116 selects columns within memory cell array 102 to which data is to be written, selection signals are generated by column decoder 116 that, in conjunction with other signals, serve to activate the write circuit associated with each selected column. As noted above, when activated, each write circuit applies a corresponding data input value to bit lines that run along the column with which the write circuit is associated. As also noted above, in the mode of operation in which a 32-byte word is being written to a location within memory cell array 102, 256 write circuits are activated to perform the write. In the mode of operation in which only a single byte is being written to a location within memory cell array 102, only 8 write circuits are activated to perform the write. This allows power to be conserved during the latter mode of operation.

Sense amplifiers 118 are connected to column decoder 116 and memory cell array 102. When column decoder 116 selects columns within memory cell array 102 from which data is to be read, selection signals are generated by column decoder 116 that, in conjunction with other signals, serve to activate a sense amplifier associated with each selected column. When activated, each sense amplifier senses a corresponding data output signal from bit lines that run along the column with which the sense amplifier is associated. In SRAM 100, there are a total of 2048 sense amplifiers, one corresponding to each column in memory cell array 102. In the mode of operation in which a 32-byte word is being read from a location within memory cell array 102, 256 sense amplifiers are activated to perform the read. In the mode of operation in which only a single byte is being read from a location within memory cell array 102, only 8 sense amplifiers are activated to perform the read. This allows power to be conserved during the latter mode of operation.

Data output buffer 120 is connected to sense amplifiers 118 and is configured to temporarily store 256 data output signals (denoted $DO_0$ through $DO_{255}$). These data output signals are provided by sense amplifiers 118. In a mode of operation in which a 32-byte word is being read from a location within memory cell array 102, all 256 data output signals will be updated when performing the read. In a mode of operation in which only a single byte is being read from a location within memory cell array 102, only 8 of the 256 data output signals will be updated when performing the read.

Control logic 104 is connected to row decoder 112, column decoder 116, write circuits 108 and sense amplifiers 118. Control logic 104 is configured to receive a plurality of control signals, including an output (or read) enable signal (denoted OE), a write enable signal (denoted WE), a clock signal (denoted CLK), and a byte enable signal (denoted BE), and to supply such signals to the appropriate logic blocks within SRAM 100 to control the manner and timing by which read and write accesses to memory cell array 102 are performed. The OE signal is used to request a read access to memory cell array 102, the WE signal is used to request a write access to memory cell array 102, the CLK signal is used to control the timing of such write and read accesses, and the BE signal is used to control whether the read/write accesses are 32-byte word accesses or single byte accesses.

A number of the foregoing elements of SRAM 100 will now be described in more detail with reference to FIGS. 2-7.

Figure 2:
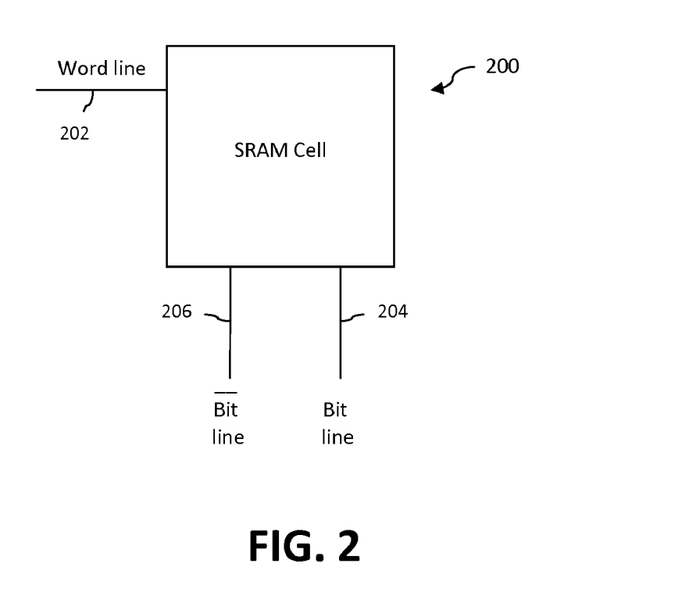
FIG. 2 depicts an example SRAM cell in accordance with an embodiment of the present invention.

FIG. 2 depicts an example SRAM cell 200. As will be appreciated by persons skilled in the art, SRAM cell 200 includes a storage cell that has two stable states that are used to denote a logical 0 and a logical 1. Access to the content of the storage cell is enabled by a word line 202 and two bit lines 204 and 206. Bit lines 204 and 206 are used to transfer data for both read and write operations. Bit line 204 carries a signal corresponding to the cell content while bit line 206 carries its inverse. While it is not necessary to use two bit lines, persons skilled in the relevant art(s) will appreciated that providing both the signal and its inverse allows for faster reading of data from the storage cell as well as improved noise margins.

Figure 3:
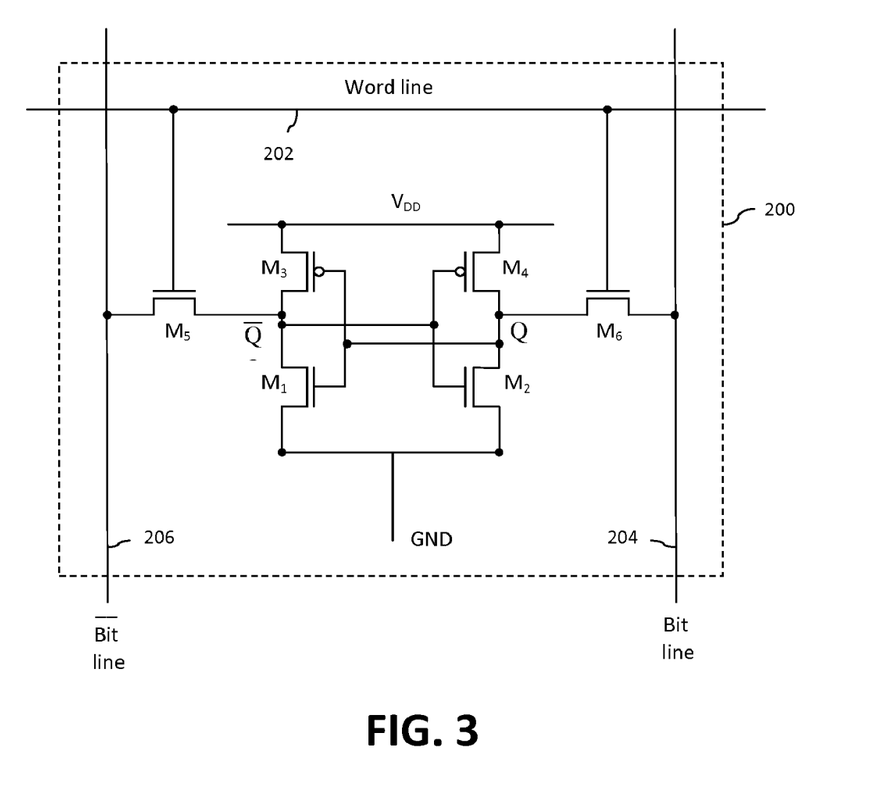
FIG. 3 is a circuit diagram depicting one example implementation of the SRAM cell of FIG. 2.

FIG. 3 depicts one example implementation of SRAM cell 200. In the implementation shown in FIG. 3, a bit value is stored on four transistors (denoted $M_1$, $M_2$, $M_3$ and $M_4$) that form two cross-coupled inverters. As noted above, this storage cell has two stable states which are used to denote a logical 0 and a logical 1. Two additional access transistors (denoted $M_5$ and $M_6$) serve to control access to the storage cell during read and write operations. Access to the storage cell is enabled by word line 202, which controls the two access transistors $M_5$ and $M_6$. These transistors, in turn, control whether the cell should be connected to bit lines 204 and 206.

The SRAM cell depicted in FIG. 3 may be in any one of three different states: a standby state in which the circuit is idle, a reading state in which the content of the storage cell has been requested, and a writing state in which the content of the storage cell is updated. During the standby state, word line 202 is not asserted and, as a result, access transistors $M_5$ and $M_6$ disconnect the storage cell from bit lines 204 and 206. During this state, the two cross-coupled inverters formed by $M_1$, $M_2$, $M_3$ and $M_4$ continue to reinforce each other as long as they are disconnected from bit lines 204 and 206.

A read cycle will now be described, assuming for the purposes of explanation that the content of the storage cell is a logical 1, stored at the node denoted Q. The read cycle is initiated by precharging bit lines 204 and 206 to a logical 1, then asserting word line 202, thereby enabling both access transistors $M_5$ and $M_6$. Subsequently, the values stored in Q and $\overline{Q}$ are transferred to bit lines 204 and 206, respectively, due to the fact that bit line 204 remains at its precharged value while bit line 206 discharges through transistors $M_1$ and $M_5$ to a logical 0. On the side of bit line 204, transistors $M_4$ and $M_6$ pull the bit line toward $V_{DD}$, a logical 1. If the content of the storage cell was a logical 0, the opposite would occur and bit line 206 would be pulled toward logical 1 and bit line 204 toward logical 0.

A write cycle is initiated by applying the value to be written to bit lines 204 and 206. If a logical 0 is to be written, a logical 0 is applied to the bit lines—in other words, bit line 204 is set to logical 0 and bit line 206 to logical 1. If a logical 1 is to be written, these values are switched. Word line 202 is then asserted and the value that is to be stored is latched into the storage cell. Note that the reason this works is that the bit line input-drivers are designed to be much stronger than the relatively weak transistors in the storage cell itself, so that they can easily override the previous state of the cross-coupled inverters.

The foregoing description of an example SRAM cell has been provided by way of example only and is not intended to limit the present invention. Persons skilled in the relevant art(s) will readily appreciate that any number of different SRAM cell designs may be used to implement SRAM cell 200.

Figure 4:
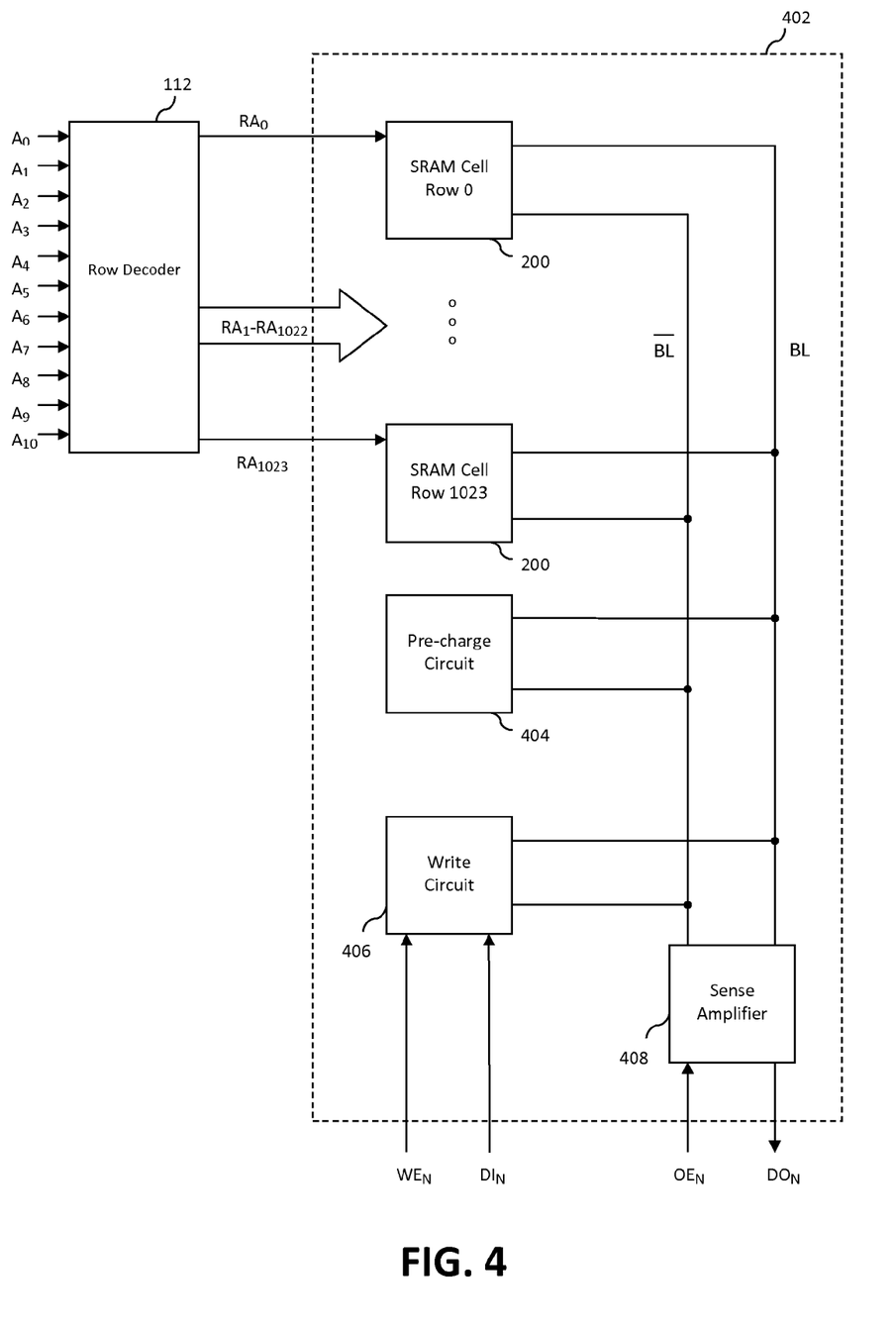
FIG. 4 is a block diagram that depicts a row decoder and circuit elements associated with a single column of a memory cell array in an SRAM in accordance with an embodiment of the present invention.

FIG. 4 is a block diagram depicting row decoder 112 and circuit elements associated with a single column of SRAM cell array 102, collectively referred to herein as column circuit 402. Column circuit 402 includes one column of memory cells within SRAM cell array 102, one write circuit from within write circuits 108, and one sense amplifier from within sense amplifiers 118, each of which were described above in reference to FIG. 1.

In particular, as shown in FIG. 4, column circuit 402 includes 1024 memory cells 200 (denoted SRAM Cell Row 0 through SRAM Cell Row 1023). Each memory cell 200 is located on a different row within SRAM cell array 102 and access to each memory cell is controlled in part by a corresponding one of 1024 word lines, denoted $RA_0$ through $RA_{1023}$. During a read or write access, row decoder 112 selectively activates one of words lines $RA_0$ through $RA_{1023}$ based on the state of address signals $A_0$ through $A_{10}$, which are received from first address buffer 110 (not shown in FIG. 4).

A precharge circuit 404 is connected to each of the 1024 memory cells 200 via two bit lines denoted BL and $\overline{BL}$. These bit lines correspond to bit lines 204 and 206 in FIGS. 9 and 10. Precharge circuit 404 is configured to charge the bit lines BL and $\overline{BL}$ to a logical high level. Precharge circuit 404 may be configured to charge the bit lines high at all times except during a read and write cycle.

A write circuit 406 is also connected to each of the 1024 memory cells 200 via bit lines BL and $\overline{BL}$. Write circuit 406 is configured to apply the value of one of 256 data input signals (denoted $DI_N$, where N may be any integer from 0 to 255) to bit lines BL and $\overline{BL}$. Write circuit 406 is configured to apply the value to the bit lines responsive to the activation of a column-specific write enable signal (denoted $WE_N$, where N may be any integer from 0 to 255).

A sense amplifier 408 is also connected to each of the 1024 memory cells 200 via bit lines BL and $\overline{BL}$. Sense amplifier 408 is configured to sense the value of one of 256 data output signals (denoted $DO_N$, where N may be any integer from 0 to 255) on bit lines BL and $\overline{BL}$. Sense amplifier 408 is configured to sense the value on the bit lines responsive to the activation of a column-specific output enable signal (denoted $DO_N$, where N may be any integer from 0 to 255).

Figure 5:
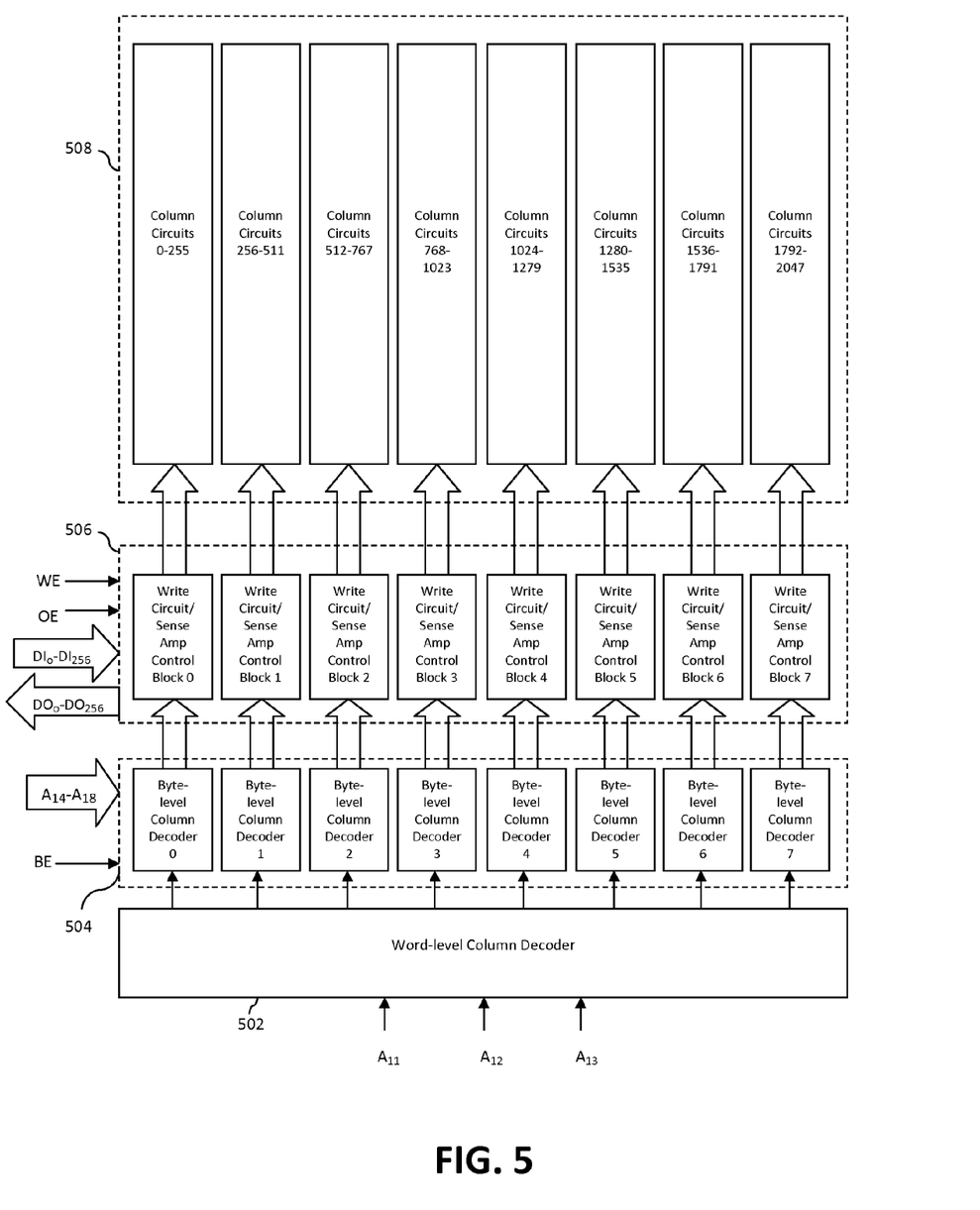
FIG. 5 is a block diagram that depicts elements of a column decoder, write circuits, sense amplifiers, and a memory cell array in an SRAM in accordance with an embodiment of the present invention.

FIG. 5 depicts elements of column decoder 116, write circuits 108, sense amplifiers 118, and memory cell array 102 in more detail. As shown in FIG. 5, column decoder 116 includes a word-level column decoder 502 and a bank 504 of eight byte-level column decoders (denoted Byte Level Column Decoders 0-7). Each byte-level column decoder is connected to a corresponding write circuit/sense amplifier control block in a bank 506 of eight such control blocks (denoted Write Circuit/Sense Amp Control Blocks 0-7). Each write circuit/sense amplifier control block is connected to a corresponding set of 256 column circuits, wherein each column circuit is configured in a like manner to column circuit 402 of FIG. 4. The complete set of 2048 column circuits is denoted 508 in FIG. 5.

Word-level column decoder 502 is configured to selectively activate one of the eight byte-level column decoders based on the state of address signals $A_{11}$, $A_{12}$ and $A_{13}$. When activated, each byte-level column decoder is configured to selectively activate one or more write circuit control sub-blocks or one or more sense amplifier control sub-blocks within its corresponding write circuit/sense amplifier control block. The number of sub-blocks activated by the byte level column decoder is controlled by address signals $A_{14}$ through $A_{18}$ and the byte enable (BE) signal. The number of sub-blocks activated by the byte level column decoder determines whether a 32-byte word access will be performed or whether a single byte access will be performed.

Figure 6:
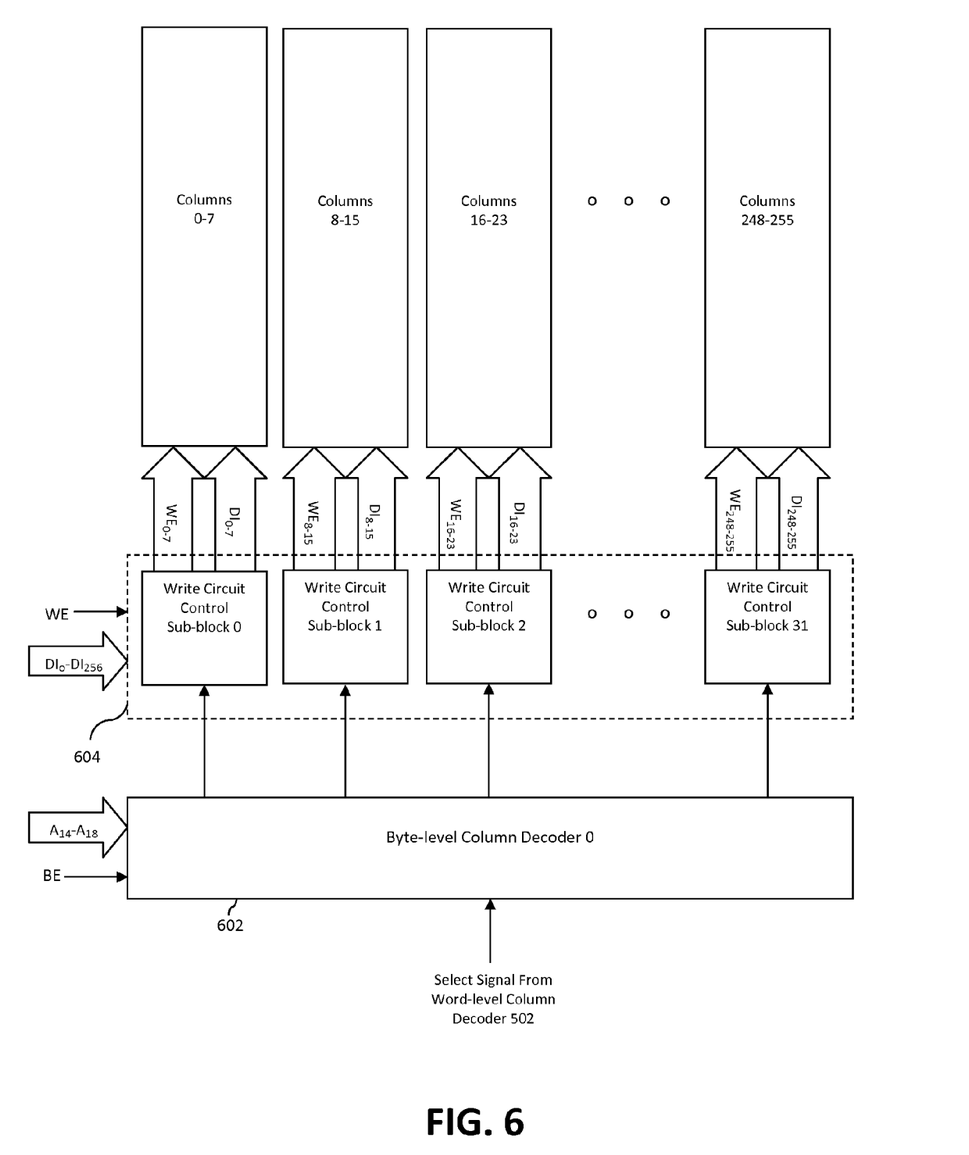
FIGS. 6 and 7 are block diagrams that depict a byte-level column decoder and an associated write circuit/sense amplifier control block in an SRAM in accordance with an embodiment of the present invention.

To further illustrate this, FIG. 6 depicts a single one of the byte-level column decoders—namely, Byte-Level Column Decoder 0 (denoted decoder 602)—along with its associated write circuit/sense amplifier control block (denoted control block 604). As shown in FIG. 6, control block 604 includes 32 write circuit control sub-blocks (denoted Write Circuit Control Sub-Blocks 0-31). Each write circuit control sub-block is connected to a corresponding set of 8 column circuits, wherein each column circuit is configured in a like manner to column circuit 402 of FIG. 4.

When byte-level column decoder 602 receives a select signal from word-level column decoder 502, it selectively activates either a single one of the 32 write circuit control sub-blocks or all 32 write circuit control sub-blocks depending on the state of address signals $A_{14}$, $A_{15}$, $A_{16}$, $A_{17}$ and $A_{18}$ and byte enable signal BE. In particular, if BE is not active, then byte-level column decoder 602 will activate all 32 write circuit control sub-blocks. However, if BE is active, then byte-level column decoder 602 will selectively activate only one of the 32 write circuit control sub-blocks, wherein the write circuit control sub-block is selected based on the state of address signals $A_{14}$, $A_{15}$, $A_{16}$, $A_{17}$ and $A_{18}$. When activated, each write circuit control sub-block propagates the write enable signal WE to 8 column circuits as column-specific write enable signals (denoted $WE_{0-7}$, $WE_{8-15}$, $WE_{16-23}$, ... $WE_{248-255}$) along with eight corresponding data input signals (denoted $DI_{0-7}$, $DI_{8-15}$, $DI_{16-23}$, ... $DI_{248-255}$). Each column-specific write enable signal and its corresponding data input signal is received by a corresponding write circuit within one of the eight column circuits connected to the write circuit control sub-block. Receipt of these signals causes each write circuit to apply the data input signal to the bit lines within the column circuit in a manner described above. Thus, when a single byte is being written (when BE is active), only eight write circuits are activated to apply a data input signal to bit lines within a column circuit. When a 32-byte word is being written, 256 write circuits are activated to apply a data input signal to bit lines within a column circuit.

Figure 7:
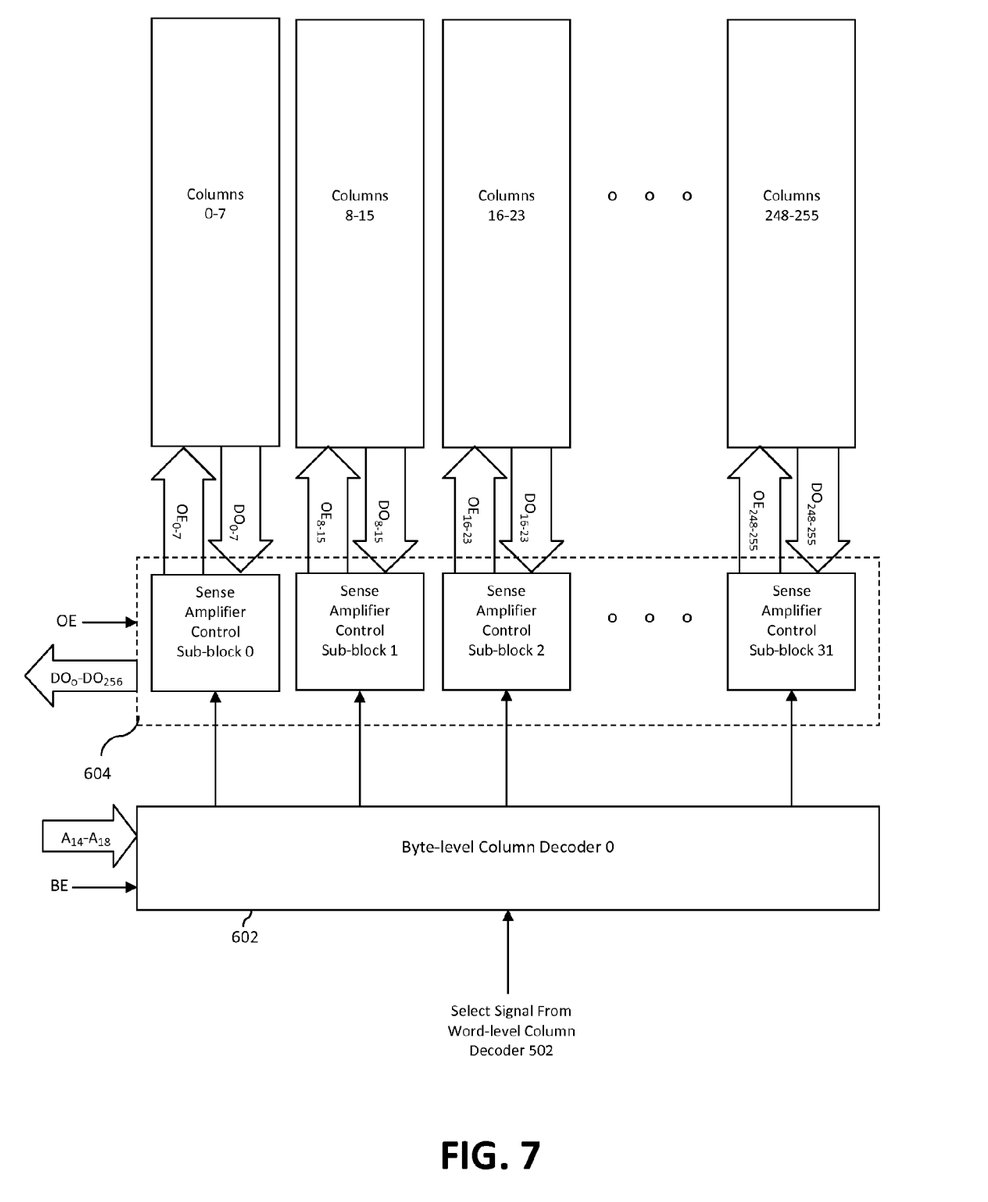

FIG. 7 also depicts Byte-Level Column Decoder 0 (still denoted decoder 602) along with its associated write circuit/sense amplifier control block (still denoted control block 604). However, FIG. 7 shows that control block 604 also includes 32 sense amplifier control sub-blocks (denoted Sense Amplifier Control Sub-Blocks 0-31). Each sense amplifier control sub-block is connected to a corresponding set of 8 column circuits, wherein each column circuit is configured in a like manner to column circuit 402 of FIG. 4.

When byte-level column decoder 602 receives a select signal from word-level column decoder 502, it selectively activates either a single one of the 32 sense amplifier control sub-blocks or all 32 sense amplifier control sub-blocks depending on the state of address signals $A_{14}$, $A_{15}$, $A_{16}$, $A_{17}$ and $A_{18}$ and byte enable signal BE. In particular, if BE is not active, then byte-level column decoder 602 will activate all 32 sense amplifier control sub-blocks. If however, BE is active, then byte-level column decoder 602 will selectively active only one of the 32 sense amplifier control sub-blocks, wherein the sense amplifier control sub-block is selected based on the state of address signals $A_{14}$, $A_{15}$, $A_{16}$, $A_{17}$ and $A_{18}$. When activated, each sense amplifier control sub-block propagates the output enable signal OE to 8 column circuits as column-specific output enable signals (denoted $OE_{0-7}$, $OE_{8-15}$, $OE_{16-23}$, ... $OE_{248-255}$) and detects eight corresponding data output signals (denoted $DO_{0-7}$, $DO_{8-15}$, $DO_{16-23}$, ... $DO_{248-255}$). Each column-specific output enable signal is received by a corresponding sense amplifier within one of the eight column circuits connected to the sense amplifier control sub-block. Receipt of this signal causes the sense amplifier to sense a data output signal on the bit lines within the column circuit in a manner described above. The sense amplifier then provides the data output signal to the sense amplifier control sub-block. Thus, when a single byte is being read (when BE is active), only eight sense amplifiers are activated to sense a data output signal on the bit lines within a column circuit. When a 32-byte word is being read, 256 sense amplifiers are activated to sense a data output signal on the bit lines within a column circuit.

Persons skilled in the relevant art(s) will readily appreciate that modifications may be made to SRAM 100 to change the size of the largest read/write access from 32 bytes, to change the size of the smaller read/write access from 1 byte, and/or to permit varying smaller access sizes.

For example, one way to accommodate a largest read/write access size other than 32 bytes would be to increase or decrease the number of address bits decoded by the word-level column decoder, thereby allowing the 2048 column circuits to be partitioned into sets of less than 256 column circuits or sets of greater than 256 column circuits. For each set of column circuits, a corresponding byte level column decoder and write circuit/sense amplifier control block would then be provided.

As a further example, one way to accommodate a smaller read/write access size other than 1 byte would be to increase or decrease the number of address bits decoded by the byte-level column decoder, thereby allowing the 256 column circuits associated with that decoder to be partitioned into sets of less than 8 column circuits or sets of greater than 8 column circuits. For each set of column circuits, a corresponding write circuit control sub-block and sense amplifier control sub-block would then be provided.

As a still further example, one way to permit varying smaller access sizes would be to use 32 byte enable signals (denoted, say, $BE_0$ through $BE_{31}$), wherein each byte enable signal is input to a corresponding one of the 32 write circuit control sub-blocks in FIG. 6 and to a corresponding one of the 32 sense amplifier control sub-blocks in FIG. 7. These byte enable signals could then be used to selectively read or write anywhere from 1 to 32 bytes of data per access.

These modifications are described by way of example only. Other modifications of SRAM 100 to change the size of the largest read/write access, to change the size of the smaller read/write, and/or to permit varying smaller access sizes will be readily apparent to persons skilled in the art(s) based on the teachings provided herein.

C. Methods of Utilization of a Power-Saving Semiconductor Memory in Accordance with an Embodiment of the Present Invention Methods of utilizing a power-saving semiconductor memory in accordance with an embodiment of the present invention will now be described. In particular, a method for reading data from the power-saving semiconductor memory will be described in reference to flowchart 800 of FIG. 8 and a method for writing data to the power-saving semiconductor memory will be described in reference to flowchart 900 of FIG. 9. The power-saving semiconductor memory includes an array of memory cells arranged as a plurality of rows and a plurality of columns. Each of these methods will be described with continued reference to example semiconductor memory 100 described above in reference to FIGS. 1-7, although the methods are by no means limited to that embodiment.

Figure 8:
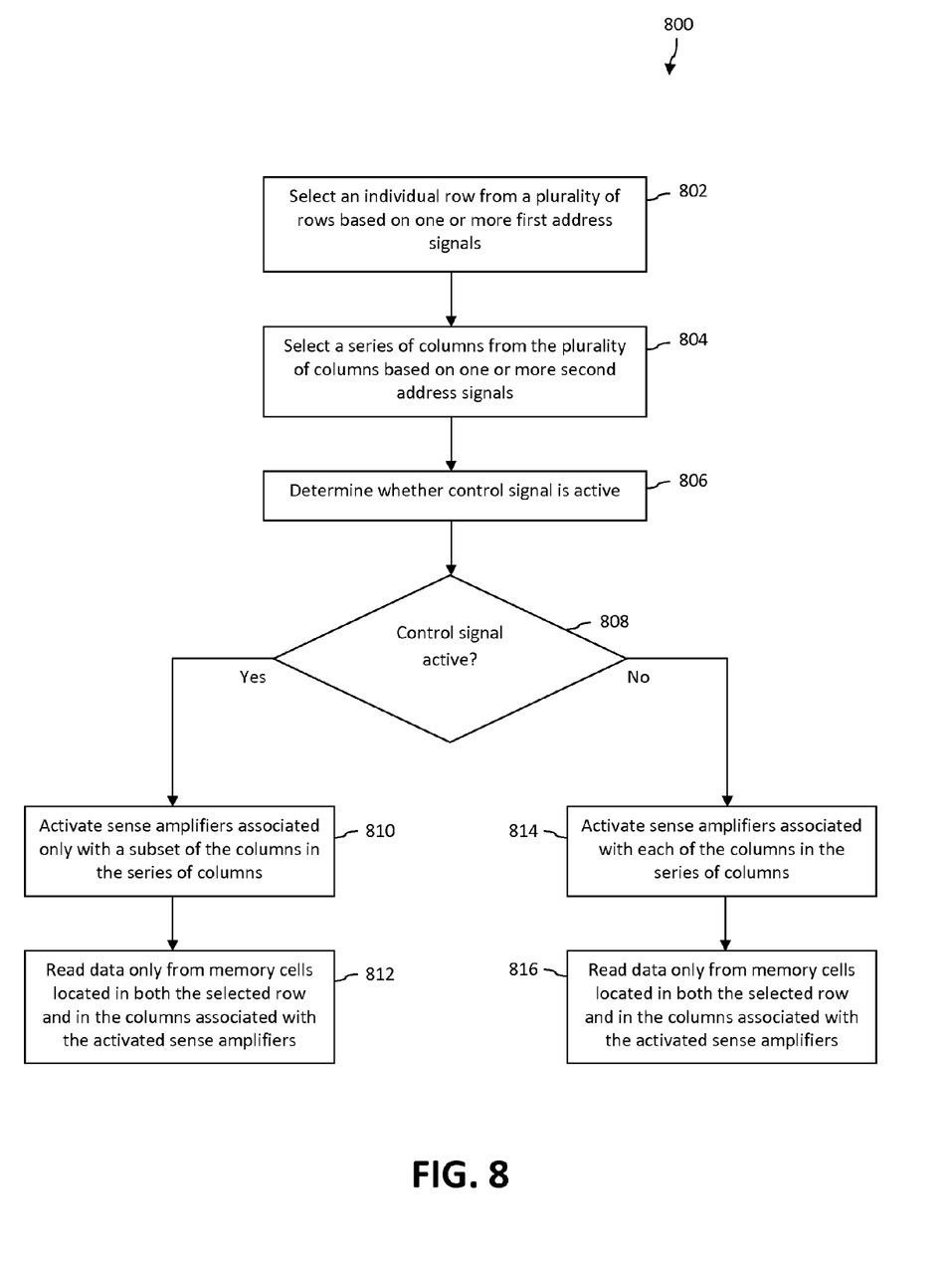
FIG. 8 depicts a flowchart of a method for reading data from a power-saving semiconductor memory in accordance with an embodiment of the present invention.

As shown in FIG. 8, the method of flowchart 800 begins at step 802, in which an individual row is selected from the plurality of rows in the memory call array based on one or more first address signals. In SRAM 100, this step is performed by row decoder 112, which selects one of 1024 rows in memory cell array 102 based on address signals $A_0$ through $A_{10}$.

At step 804, a series of columns is selected from the plurality of columns in the memory cell array based on one or more second address signals. In SRAM, this step is performed by word-level column decoder 502, which selects one out of eight series of 256 columns in memory cell array 102 based on address signals $A_{11}$, $A_{12}$, and $A_{13}$. This selection is performed by activating only a single one out of eight byte-level column decoders associated with memory cell array 102. These eight byte-level column decoders are depicted in FIG. 5 as byte-level column decoders 0-7.

At step 806, it is determined whether a control signal is active. In SRAM 100, this step is performed by the byte-level column decoder that was selected in step 804. An example of such a control block is control block 604 depicted in FIG. 6 and FIG. 7. In SRAM 100, the control signal is byte enable signal BE.

At decision step 808, if the control signal is active, then processing proceeds to steps 810 and 812. At step 810, sense amplifiers associated only with a subset of the columns in the series of columns are activated. In SRAM 100, this step is performed by the byte-level column decoder that was selected in step 804, which activates sense amplifiers corresponding to only 8 of the 256 columns associated with the byte-level column decoder when BE is active. The 8 columns are selected based on address signals $A_{14}$, $A_{15}$, $A_{16}$, $A_{17}$ and $A_{18}$. At step 812, data is read only from the memory cells located in both the row selected in step 802 and in the columns associated with the sense amplifiers that were activated in step 810.

However, if the control signal is inactive, then at decision step 808 processing proceeds to steps 814 and 816. At step 814, sense amplifiers associated with each of the columns in the series of columns are activated. In SRAM 100, this step is performed by the byte-level column decoder that was selected in step 804, which activates the sense amplifiers corresponding to all of the 256 columns associated with the byte-level column decoder when BE is inactive. At step 816, data is read from the memory cells located in both the row selected in step 802 and in the columns associated with the sense amplifiers that were activated in step 814.

Figure 9:
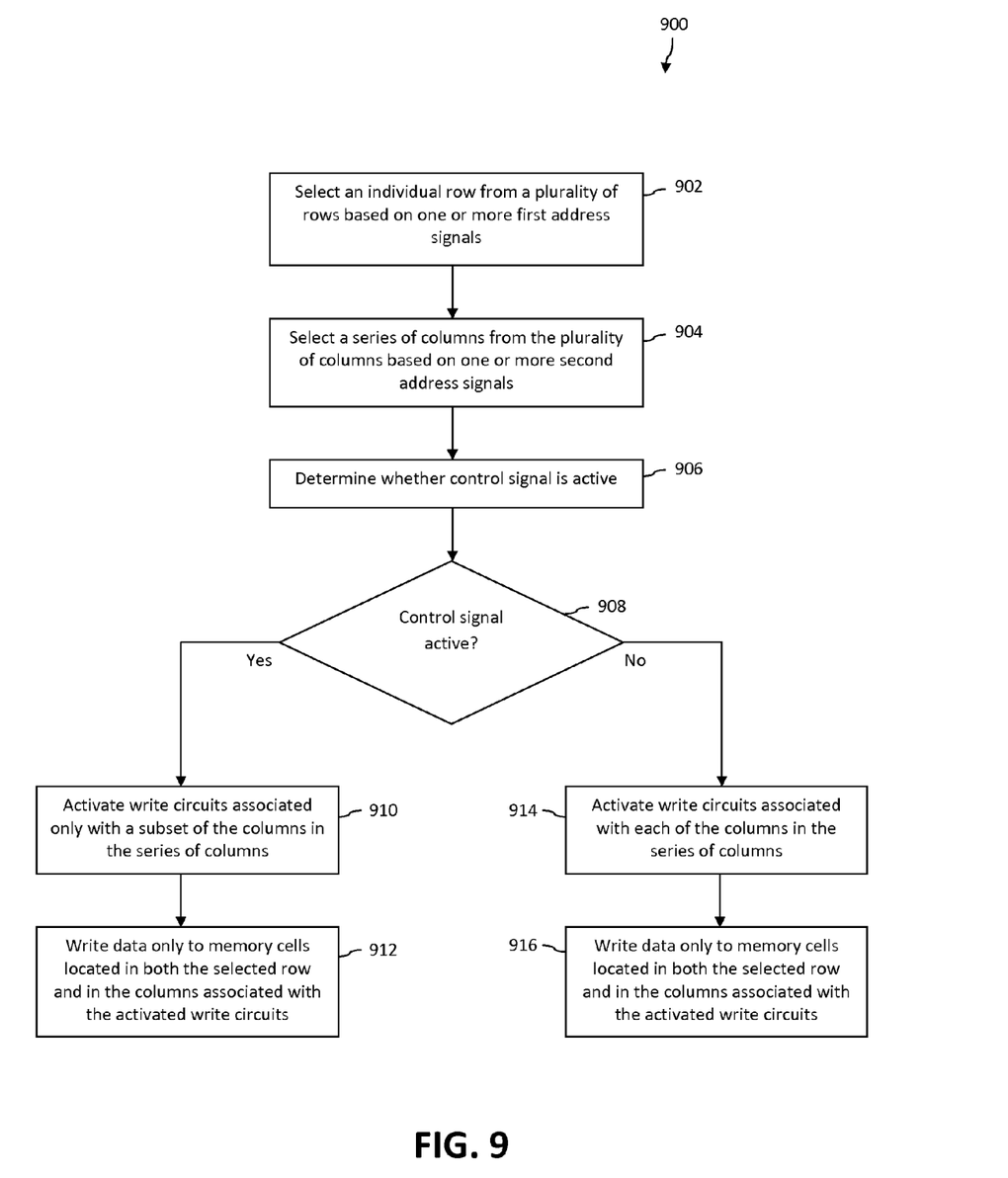
FIG. 9 depicts a flowchart of a method for writing data to a power-saving semiconductor memory in accordance with an embodiment of the present invention.

The method of flowchart 900 will now be described. As shown in FIG. 9, the method begins at step 902, in which an individual row is selected from the plurality of rows in the memory call array based on one or more first address signals. In SRAM 100, this step is performed by row decoder 112, which selects one of 1024 rows in memory cell array 102 based on address signals $A_0$ through $A_{10}$.

At step 904, a series of columns is selected from the plurality of columns in the memory cell array based on one or more second address signals. In SRAM, this step is performed by word-level column decoder 502, which selects one out of eight series of 256 columns in memory cell array 102 based on address signals $A_{11}$, $A_{12}$, and $A_{13}$. This selection is performed by activating only a single one out of eight byte-level column decoders associated with memory cell array 102. These eight byte-level column decoders are depicted in FIG. 5 as byte-level column decoders 0-7.

At step 906, it is determined whether a control signal is active. In SRAM 100, this step is performed by the byte-level column decoder that was selected in step 904. An example of such a control block is control block 604 depicted in FIG. 6 and FIG. 7. In SRAM 100, the read-related control signal is byte enable signal BE.

At decision step 908, if the control signal is active, then processing proceeds to steps 910 and 912. At step 910, write circuits associated only with a subset of the columns in the series of columns are activated. In SRAM 100, this step is performed by the byte-level column decoder that was selected in step 904, which activates write circuits corresponding to only 8 of the 256 columns associated with the byte-level column decoder when BE is active. The 8 columns are selected based on address signals $A_{14}$, $A_{15}$, $A_{16}$, $A_{17}$ and $A_{18}$. At step 912, data is written only to the memory cells located in both the row selected in step 902 and in the columns associated with the sense amplifiers that were activated in step 910.

However, if the read-related control signal is inactive, then at decision step 908 processing proceeds to steps 914 and 916. At step 914, write circuits associated with each of the columns in the series of columns are activated. In SRAM 100, this step is performed by the byte-level column decoder that was selected in step 904, which activates the write circuits corresponding to all of the 256 columns associated with the byte-level column decoder when BE is inactive. At step 916, data is written to the memory cells located in both the row selected in step 902 and in the columns associated with the sense amplifiers that were activated in step 914.

D. Example Application of Power-Saving Semiconductor Memory for MPE-FEC Operations in Accordance with an Embodiment of the Present Invention This section will describe the use of a power-saving semiconductor memory in accordance with the present invention for performing MPE-FEC (Multiprotocol Encapsulation-Forward Error Correction) operations in a DVB-H (Digital Video Broadcasting-Handheld) receiver. This application is just one example of various applications that may benefit from the use of a power-saving semiconductor memory in accordance with an embodiment of the present invention. Accordingly, the following description is not intended to limit the present invention in any way.

Conventional DVB-H receivers perform error correction operations in accordance with MPE-FEC technique. In accordance with this technique, the receiver loads Internet Protocol (IP) packets and associated parity data corresponding to an MPE-FEC frame into a table. The IP packets and associated parity data are loaded into the table as a series of byte-wide columnar segments. So loaded, the rows of the table are then treated as Reed Solomon (RS) codewords for the purpose of performing error correction operations. Erasure information associated with each byte in the MPE-FEC frame is also stored and is used to improve the performance of the RS decoding.

Figure 10:
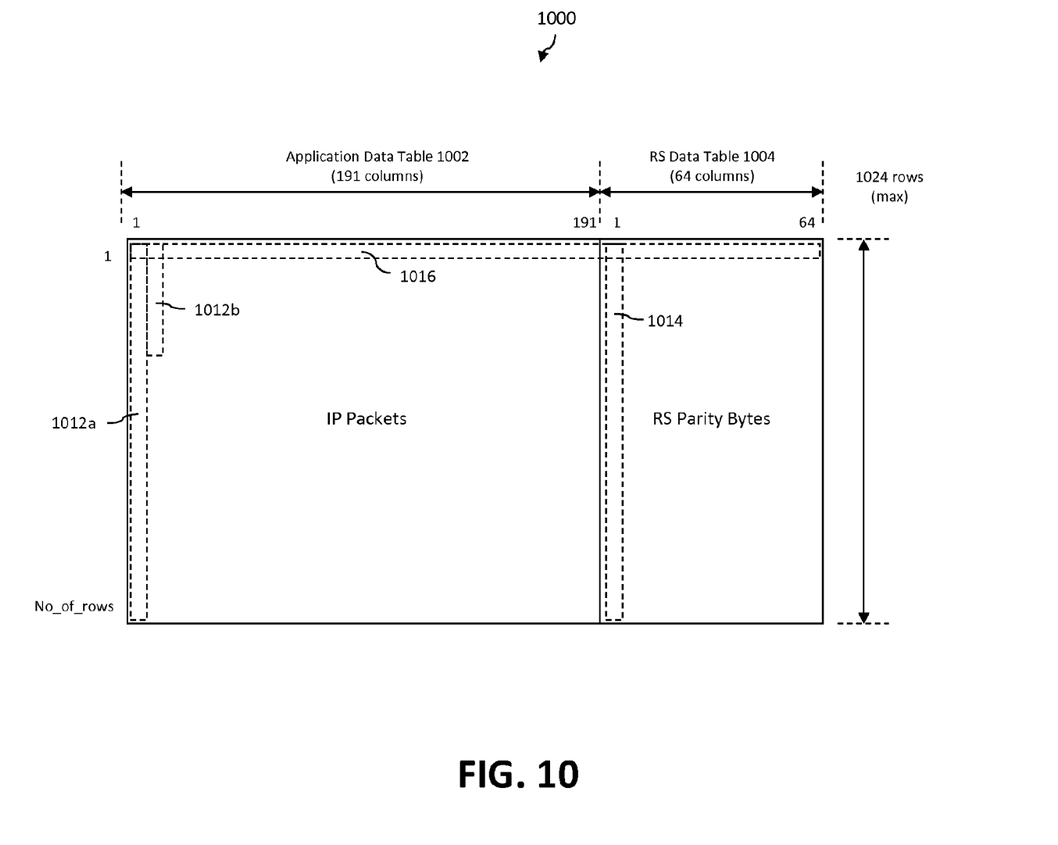
FIG. 10 depicts the structure of an MPE-FEC (Multiprotocol Encapsulation-Forward Error Correction) frame.

FIG. 10 depicts the structure 1000 of an MPE-FEC frame. Each MPE-FEC frame consists of 255 columns and a maximum of 1024 rows. Each cell within the frame corresponds to a single byte and the maximum frame size is approximately 2 Mbits. As shown in FIG. 10, the frame is separated into two adjacent tables: an application data table 1002 and an RS data table 1004.

During decoding, the 191 columns of application data table 1002 are populated with IP packets (and optional padding bytes) while the 64 columns of RS data table 1004 are respectively populated with 64 associated RS parity byte segments. The IP packets and RS parity byte data are loaded from left to right in a column-by-column fashion. To demonstrate this, FIG. 10 depicts an example IP packet 1012 that has been loaded into application data table 1002 as two byte-wide columnar segments 1012a and 1012b. FIG. 10 further depicts an example RS parity byte segment 1014 that has been loaded into RS data table 1004 as a single byte-wide columnar segment.

Once application data table 1002 and RS data table 1004 have been populated, RS decoding is performed on the data stored therein in a row-by-row fashion, wherein each row represents a RS codeword. To help illustrate this, FIG. 10 depicts a single RS codeword 1016 that spans application data table 1002 and RS data table 1004. The RS decoding is performed in accordance with an RS (255,191) code. The RS decoding is used to correct a limited number of errors in each of the RS codewords. As noted above, stored erasure information associated with each byte in the MPE-FEC frame is used to improve the performance of the RS decoding.

After the RS decoding is complete, the IP packets stored in application data table 1002 are read back out of the table in a column-by-column fashion for downstream processing and subsequent transmission to an application.

One logical choice for storing an MPE-FEC frame during the foregoing decoding operations is a semiconductor memory, such as an SRAM, that includes an array of memory cells having row and column dimensions that match or exceed that of the MPE-FEC frame. Ideally, the semiconductor memory should allow for read and write accesses of large words of data (e.g., 32 bytes of data), so that the Reed Solomon encoding and decoding operations can be performed with as few memory accesses as possible, thereby speeding up those operations.

On the other hand, when the columns of the memory array are initially being populated with IP packets and RS parity bytes or are later being drained of IP packets, single byte accesses must be used. If the semiconductor memory is configured to read and write only large words of data, these byte accesses will be extremely inefficient from a power standpoint. For example, during a read operation, the sense amplifiers associated with an entire word of data will be activated, even though only a single byte of data need be read. Likewise, during a write operation, write circuits will propagate data along the bit lines associated with an entire word of data, even though only a single byte of data need be written. Since approximately 50% of the memory accesses needed to implement the MPE-FEC scheme will be byte accesses, these inefficiencies will result in a large cumulative waste of power.

Figure 11:
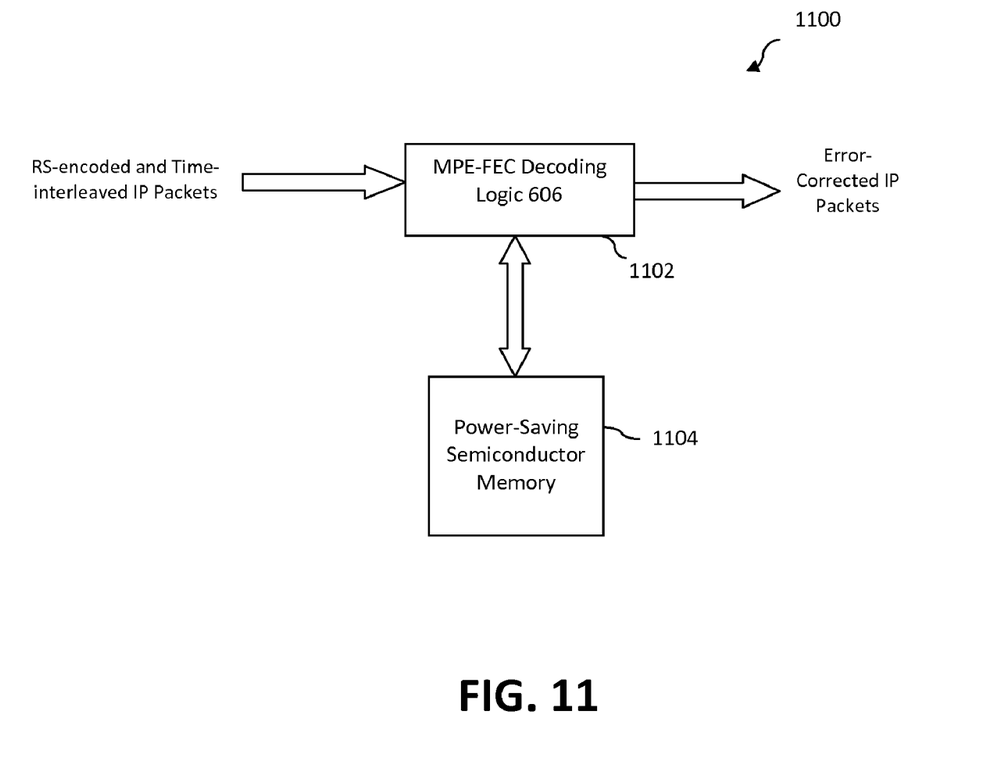
FIG. 11 is a block diagram of an MPE-FEC decoding system that includes MPE-FEC decoding logic and a power-saving semiconductor memory in accordance with an embodiment of the present invention.

In accordance with one embodiment of the present invention, a power saving semiconductor memory such as that described above in reference to FIGS. 1-7 is used to store an MPE-FEC frame during MPE-FEC decoding operations. This is depicted in FIG. 11, which shows an MPE-FEC decoding system 1100 that includes MPE-FEC decoding logic 1102 for performing MPE-FEC decoding operations as described above and a power-saving semiconductor memory 1104 for storing an MPE-FEC frame during the performance of such operations.

In a first mode operation, power-saving semiconductor memory 1104 allows for reads and writes of large words of data (e.g., 32 bytes of data), so that Reed Solomon decoding operations can be performed with as few memory accesses as possible, thereby speeding up those operations. In a second mode of operation, power-saving semiconductor memory 1104 allows for single byte accesses when the columns of the memory array are initially being populated with IP packets and RS parity bytes or are later being drained of IP packets. These single-byte accesses consume less power than the large word accesses used for Reed Solomon decoding. The manner in which power saving semiconductor memory 1104 is implemented to support such multi-mode power-saving operation is described in detail above with reference to FIGS. 1-9.

By using a power-saving semiconductor memory in a DVB-H receiver as described above, power consumption can be reduced in the DVB-H receiver. Since DVB-H receivers are typically used in portable and handheld devices that operate off of battery power, such power-saving operation can help to increase the amount of time that such devices can operate using a limited power supply.

E. Conclusion

While various embodiments of the present invention have been described above, it should be understood that they have been presented by way of example only, and not limitation. For example, although one SRAM implementation is described above in reference to FIGS. 1-7, persons skilled in the relevant art(s) will readily appreciate that many other implementations may be used to implement the present invention. For example, a dual-ported SRAM or an SRAM having different dimensions may be used. Also, multiple SRAMs may be used. Furthermore, the present invention is not limited to SRAMs and any type of semiconductor memory that includes memory cells arranged in rows and columns may be used to practice the invention.

Also, although the SRAM implementation described above in reference to FIGS. 1-7 describes allowing byte accesses and 32-byte word accesses, the invention is not so limited. The invention encompasses accesses of any size provided that in one mode of operation a smaller access can be used and provided that power is conserved during the smaller access.

It will be understood by those skilled in the relevant art(s) that various changes in form and details may be made to the embodiments of the present invention described herein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A method for writing data to an array of memory cells arranged as a plurality of rows and a plurality of columns, comprising:
    selecting an individual row from the plurality of rows based on one or more first address signals;
    selecting a series of columns from the plurality of columns based on one or more second address signals, wherein the series of columns corresponds to the largest amount of data that can be written to the array of memory cells at one time;
    determining whether a control signal is active; and
    responsive to determining that the control signal is active,
        activating write circuits associated only with a subset of the columns in the series of columns, and
        writing data only to memory cells located in both the selected row and in the columns associated with the activated write circuits, thereby writing an amount of data that is smaller than the largest amount of data that can be written to the array of memory cells at one time.

2. The method of claim 1, wherein the array of memory cells comprises an array of static random access memory (SRAM) cells.

3. The method of claim 1, wherein selecting a series of columns from the plurality of columns comprises:
    selecting a number of columns corresponding to a word of data, wherein a word of data includes a greater number of bits than a byte of data.

4. The method of claim 3, wherein activating write circuits associated only with a subset of the columns in the series of columns comprises:
    activating write circuits associated with a number of columns corresponding to a byte of data.

5. The method of claim 1, further comprising:
    responsive to determining that the control signal is not active, activating write circuits associated with each of the columns in the series of columns, and
    writing data only to memory cells located in both the selected row and in the columns associated with the activated write circuits.

6. A semiconductor memory, comprising:
    an array of memory cells arranged as a plurality of rows and a plurality of columns;
    a row decoder coupled to the array of memory cells and configured to select an individual row from the plurality of rows based on one or more first address signals;
    a first column decoder coupled to the array of memory cells and configured to select a series of columns from the plurality of columns based on one or more second address signals, wherein the series of columns corresponds to the largest amount of data that can be written to the array of memory cells at one time;
    a second column decoder coupled to the first column decoder and the array of memory cells, the second column decoder configured to determine whether a control signal is active and, responsive to determining that the control signal is active, to activate write circuits associated only with a subset of the columns in the series of columns and to write data only to memory cells located in both the selected row and in the columns associated with the activated write circuits, thereby writing an amount of data that is smaller than the largest amount of data that can be written to the array of memory cells at one time.

7. The semiconductor memory of claim 6, wherein the array of memory cells comprises an array of static random access memory (SRAM) cells.

8. The semiconductor memory of claim 6, wherein the first column decoder is configured to select a series of columns from the plurality of columns by selecting a number of columns corresponding to a word of data, wherein a word of data includes a greater number of bits than a byte of data.

9. The semiconductor memory of claim 8, wherein the second column decoder is configured to activate write circuits associated only with a subset of the columns in the series of columns by activating write circuits associated with a number of columns corresponding to a byte of data.

10. The semiconductor memory of claim 6, wherein the second column decoder is further configured, responsive to determining that the control signal is not active, to activate write circuits associated with each of the columns in the series of columns and to write data only to memory cells located in both the selected row and in the columns associated with the activated write circuits.

\* \* \* \* \*